(12) United States Patent  (10) Patent No.: US 7,400,049 B2
Shim et al.  (45) Date of Patent: Jul. 15, 2008

(54) INTEGRATED CIRCUIT PACKAGE SYSTEM WITH HEAT SINK

(75) Inventors: Il Kwon Shim, Singapore (SG); Henry D. Bathan, Singapore (SG); Zigmund Ramirez Camacho, Singapore (SG); Jeffrey D. Punzalan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 11/307,683

(22) Filed: Feb. 16, 2006

(65) Prior Publication Data

US 2007/0187839 A1  Aug. 16, 2007

(51) Int. Cl.
*H01L 23/28* (2006.01)

(52) U.S. Cl. .................. 257/796; 257/707; 257/787

(58) Field of Classification Search ............. 257/706, 257/707, 686, 783, 787, 796, 666, 676
See application file for complete search history.

(56) References Cited

U.S. PATENT DOCUMENTS

| | | | | |
|---|---|---|---|---|
| 5,796,160 A | * | 8/1998 | Kozono ............... | 257/675 |
| 5,854,511 A | * | 12/1998 | Shin et al. ............ | 257/713 |
| 6,198,163 B1 | * | 3/2001 | Crowley et al. ....... | 257/706 |
| 6,249,433 B1 | * | 6/2001 | Huang et al. ......... | 361/704 |
| 6,333,211 B1 | * | 12/2001 | Sato et al. ............ | 438/126 |
| 6,396,139 B1 | * | 5/2002 | Huang ................. | 257/696 |
| 6,459,148 B1 | | 10/2002 | Chun-Jen et al. ..... | 257/692 |
| 6,472,250 B1 | * | 10/2002 | Puschner et al. ..... | 438/112 |
| 6,545,350 B2 | * | 4/2003 | Ho et al. .............. | 257/706 |
| 6,555,918 B2 | | 4/2003 | Masuda et al. ....... | 257/777 |
| 6,559,536 B1 | * | 5/2003 | Katoh et al. .......... | 257/712 |
| 6,664,617 B2 | * | 12/2003 | Siu .................... | 257/669 |
| 6,700,206 B2 | | 3/2004 | Kinsman .............. | 257/777 |
| 6,838,752 B2 | * | 1/2005 | Diot .................... | 257/666 |
| 6,906,424 B2 | | 6/2005 | Kinsman .............. | 257/777 |
| 6,943,433 B2 | * | 9/2005 | Kamada ............... | 257/666 |
| 6,963,141 B2 | | 11/2005 | Lee et al. .............. | 257/796 |
| 7,145,222 B2 | * | 12/2006 | Gai ..................... | 257/667 |

* cited by examiner

*Primary Examiner*—S. V Clark
(74) *Attorney, Agent, or Firm*—Mikio Ishimaru

(57) ABSTRACT

An integrated circuit package system is provided forming an external interconnect from a padless lead frame, encapsulating a heat sink and the external interconnect, mounting an integrated circuit die on the heat sink, and encapsulating the integrated circuit die, the heat sink, and the external interconnect.

12 Claims, 3 Drawing Sheets

INTEGRATED CIRCUIT PACKAGE SYSTEM WITH HEAT SINK

TECHNICAL FIELD

The present invention relates generally to integrated circuit packages and more particularly to integrated circuit packages with heat sinks.

BACKGROUND ART

Consumer electronics requirements demand more integrated circuits in an integrated circuit package while paradoxically providing less physical space in the system for the increased integrated circuits content. Some technologies primarily focus on integrating more functions into each integrated circuit. Other technologies focus on stacking these integrated circuits into a single package. As more functions are packed into the integrated circuits and more integrated circuits into the package, more heat is generated degrading the performance and potentially the reliability of the integrated circuits. While these approaches provide more functions within an integrated circuit, they do not fully address the requirements for lower height, smaller space, heat dissipation, and cost reduction.

Modern consumer electronics, such as smart phones, personal digital assistants, and location based services devices, are packing more integrated circuits into an ever shrinking physical space with expectations for decreasing cost. Contemporary consumer electronics expose integrated circuits and packages to more demanding and sometimes new environmental conditions, such as cold, heat, and humidity requiring integrated circuit packages to provide robust thermal management structures. Numerous technologies have been developed to meet these requirements. Some of the research and development strategies focus on new package technologies while others focus on improving the existing and mature package technologies. Research and development in the existing package technologies may take a myriad of different directions.

One proven way to reduce cost is to use mature package technologies with existing manufacturing methods and equipments. Paradoxically, the reuse of existing manufacturing processes does not typically result in the reduction of package dimensions. Existing packaging technologies struggle to cost effectively meet the ever demanding thermal requirements of today's integrated circuits and packages.

Thus, a need still remains for an integrated circuit package system providing low cost manufacturing, improved thermal performance, and reduce the integrated circuit package dimensions. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming an external interconnect from a padless lead frame, encapsulating a heat sink and the external interconnect, mounting an integrated circuit die on the heat sink, and encapsulating the integrated circuit die, the heat sink, and the external interconnect.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. The same numbers are used in all the figures to relate to the same elements.

The term "horizontal" as used herein is defined as a plane parallel to the conventional integrated circuit surface, regardless of its orientation. The term "vertical" refers to a direction perpendicular to the horizontal as just defined. Terms, such as "on", "above", "below", "bottom", "top", "side"(as in "sidewall"), "higher", "lower", "upper", "over", and "under", are defined with respect to the horizontal plane.

The term "processing" as used herein includes deposition of material, patterning, exposure, development, etching, cleaning, molding, and/or removal of the material or as required in forming a described structure.

Figure 1:
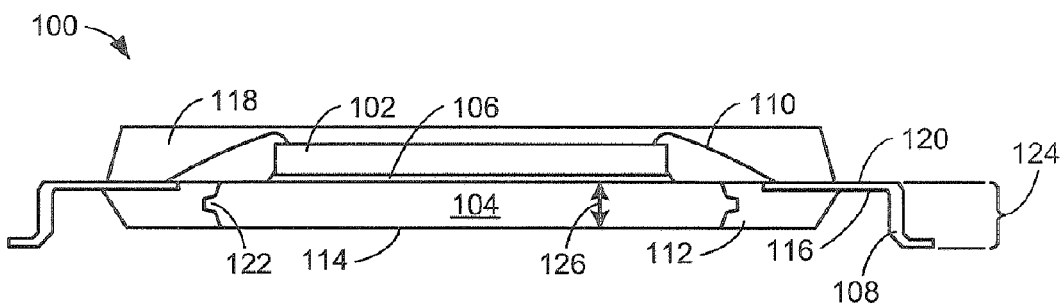
FIG. 1 is a cross-sectional view of a first integrated circuit package system in an embodiment of the present invention.

Referring now to FIG. 1, therein is shown a cross-sectional view of a first integrated circuit package system 100 in an embodiment of the present invention. The first integrated circuit package system 100 includes an integrated circuit die 102, such as a wire bond integrated circuit, on a heat sink 104 with an adhesive 106, such as a thermally conductive adhesive, in between. The integrated circuit die 102 connects to external interconnects 108, such as leads of a padless lead frame (not shown), with electrical interconnects 110, such as bond wires.

A first molding compound 112, such as an epoxy molding compound, encapsulates the heat sink 104, with a bottom surface 114 of the heat sink 104 may be exposed, and an inner portion of the external interconnects 108 from a bottom 116 of the external interconnects 108. The heat sink 104 is within the center of the padless lead frame not contacting the external interconnects 108. A second molding compound 118, such as an epoxy molding compound, encapsulates the integrated circuit die 102, the electrical interconnects 110, and the inner portion of the external interconnects 108 from a top 120 of the external interconnects 108.

For illustrative purpose, heights of the first molding compound 112 and the second molding compound 118 from the external interconnects 108 are shown as substantially the same, although it is understood that the heights may differ. Also for illustrative purpose, the first molding compound 112 and the second molding compound 118 as shown as different, although it is understood that the first molding compound 112 and the second molding compound 118 may not be different.

The heat sink 104 serves as a die paddle with beveled sides from a top and the bottom of the heat sink 104 forming a registration 122, such as a protrusion or a mold interlock, at a mid section of the heat sink 104. The registration 122 anchors the heat sink 104 in the first molding compound 112. The registration 122 as well as the beveled top and bottom of the heat sink 104 do not contact the external interconnects 108 avoiding inadvertent electrical connections. For illustrative purpose, the heat sink 104 is shown with the registration 122, although it is understood that the heat sink 104 may be a different shape, such as a trapezoid, and may optional have a mold interlock feature.

An interconnect height 124 of the external interconnects 108 exceeds a sink thickness 126 of the heat sink 104 and the height of the first molding compound 112, which are of equal thickness. The heat sink 104 and the first molding compound 112 do not impede connections of the external interconnects 108 to the next system level (not shown), such as a printed circuit board.

The heat sink 104 provides a thermal conduction path for the heat to flow from the integrated circuit die 102. The heat sink 104 in the first molding compound 112 does not increase the size or outline of the first integrated circuit package system 100 allowing re-use of existing manufacturing equipments.

Figure 2:
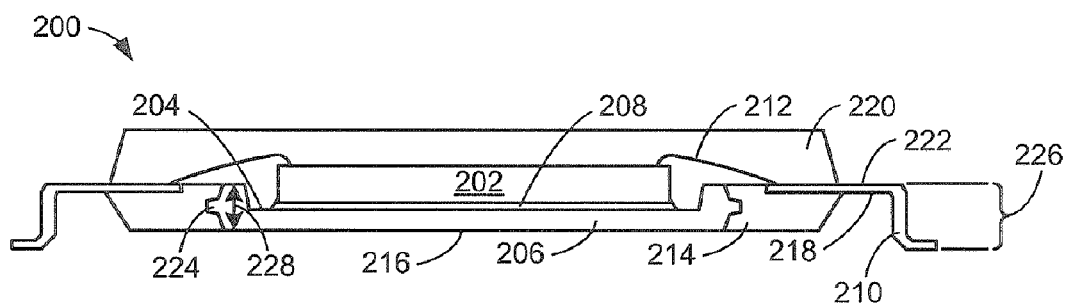
FIG. 2 is a cross-sectional view of a second integrated circuit package system in an alternative embodiment of the present invention.

Referring now to FIG. 2, therein is shown a cross-sectional view of a second integrated circuit package system 200 in an alternative embodiment of the present invention. The second integrated circuit package system 200 includes an integrated circuit die 202, such as a wire bond integrated circuit, on a recess 204 of a heat sink 206 with an adhesive 208, such as a thermally conductive adhesive, in between. The integrated circuit die 202 connects to external interconnects 210, such as leads of a lead frame (not shown), with electrical interconnects 212, such as bond wires.

A first molding compound 214, such as an epoxy molding compound, encapsulates the heat sink 206, with a bottom surface 216 of the heat sink 206 may be exposed, and an inner portion of the external interconnects 210 from a bottom 218 of the external interconnects 210. The heat sink 206 is within the center of the padless lead frame not contacting the external interconnects 210. A second molding compound 220, such as an epoxy molding compound, encapsulates the integrated circuit die 202, the electrical interconnects 212, and the inner portion of the external interconnects 210 from a top 222 of the external interconnects 210. The second molding compound 220 fills the recess 204 to surround the integrated circuit die 202.

For illustrative purpose, heights of the first molding compound 214 and the second molding compound 220 from the external interconnects 210 are shown as substantially the same, although it is understood that the heights may differ. Also for illustrative purpose, the first molding compound 214 and the second molding compound 220 as shown as different, although it is understood that the first molding compound 214 and the second molding compound 220 may not be different.

The recess 204 serves as a die paddle and lowers the integrated circuit die 202 resulting in a lower height or profile of the second integrated circuit package system 200. The recess 204 also shortens lengths of the electrical interconnects 212 resulting in improved electrical performance and smaller wire loops for improved electrical connection reliability.

The heat sink 206 has beveled sides from a top and a bottom of the heat sink 206 forming a registration 224, such as a protrusion or a mold interlock, at a mid section of the heat sink 206. The registration 224 anchors the heat sink 206 in the second molding compound 220. The registration 224 as well as the beveled top and bottom of the heat sink 206 do not contact the external interconnects 21 0 avoiding inadvertent electrical connections. For illustrative purpose, the heat sink 206 is shown with the registration 224, although it is understood that the heat sink 206 may be a different shape, such as a trapezoid, and may optional have a mold interlock feature.

An interconnect height 226 of the external interconnects 210 exceeds a sink thickness 228 of the heat sink 206 and the height of the second molding compound 220 such that the heat sink 206 and the second molding compound 220 do not impede connections of the external interconnects 210 to the next system level (not shown), such as a printed circuit board.

The heat sink 206 provides a thermal conduction path for the heat to flow from the integrated circuit die 202. The heat sink 206 in the first molding compound 214 does not increase the size or outline of the second integrated circuit package system 200 allowing re-use of existing manufacturing equipments.

Figure 3:
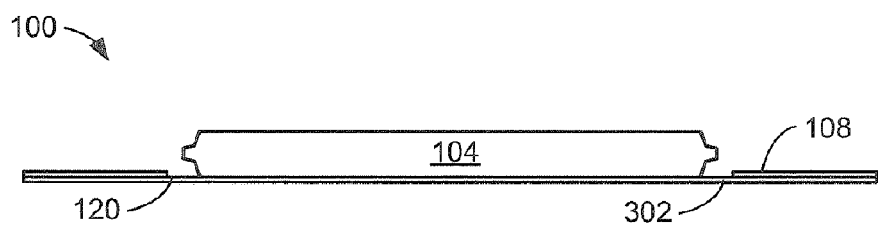
FIG. 3 is a cross-sectional view of the first integrated circuit package system in a mounting phase of the heat sink.

Referring now to FIG. 3, therein is shown a cross-sectional view of the first integrated circuit package system 100 in a mounting phase of the heat sink 104. A coverlay tape 302 attaches to the top 120 of the external interconnects 108. The heat sink 104 attaches to the coverlay tape 302. The heat sink 104 may be picked and placed on the coverlay tape 302 for an adhesiveless attachment or may be provided pre-attached by a lead frame supplier. The heat sink 104 does not contact the external interconnects 108 avoiding inadvertent connections.

Figure 4:
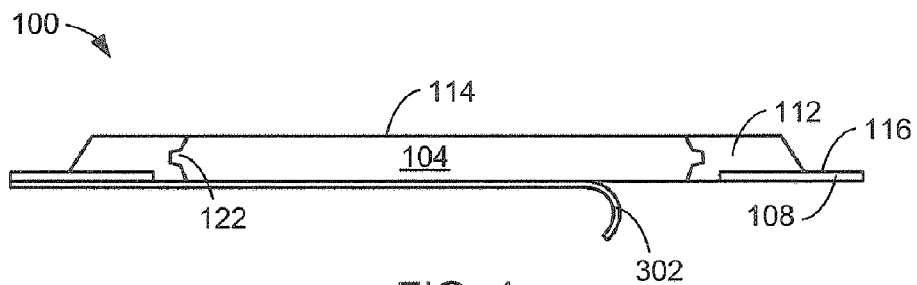
FIG. 4 is a cross-sectional view of the first integrated circuit package system in a first encapsulation phase with the first molding compound.

Referring now to FIG. 4, therein is shown a cross-sectional view of the first integrated circuit package system 100 in a first encapsulation phase with the first molding compound 112. The first molding compound 112 encapsulates the heat sink 104 with the registration 122 acting as an anchor. The first molding compound 112 encapsulates the inner portion of the external interconnects 108 from the bottom 116. The bottom surface 114 of the heat sink 104 may be exposed with a number of processes, such as chemical and mechanical planarization (CMP). An optional post-mold deflash process, such as a mechanical or chemical deflash, may be performed to eliminate resin bleeds and mold flash on the heat sink 104 and wire bonding surfaces on the external interconnects 108. The heat sink 104 within the first molding compound 112 eliminates the need for epoxy paste dispensing and curing for the attachment of the heat sink 104. The coverlay tape 302 is removed from the structure for further processing. For illustrative purpose, the coverlay tape 302 is shown as curled from the removing action, such as peeling, although it is understood that the coverlay tape 302 is typically planar next to the heat sink 104, the external interconnects 108, and the first molding compound 112.

Figure 5:
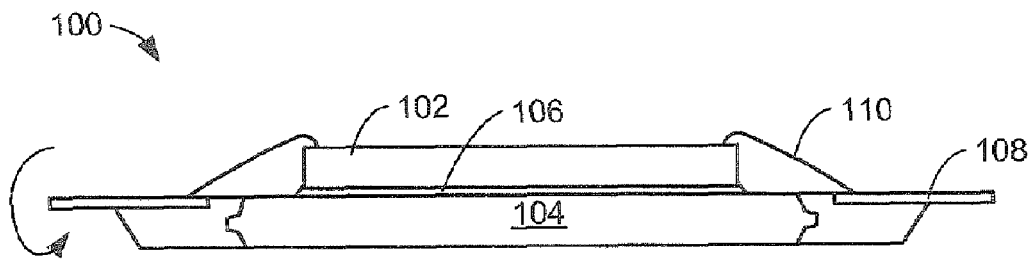
FIG. 5 is a cross-sectional view of the first integrated circuit package system in an attachment phase of the integrated circuit die.

Referring now to FIG. 5, therein is shown a cross-sectional view of the first integrated circuit package system 100 in an attachment phase of the integrated circuit die 102. The integrated circuit die 102 attaches to the heat sink 104 with the adhesive 106. The electrical interconnects 110 connect the integrated circuit die 102 and the inner portion of the external interconnects 108. The heat sink 104 is exposed such that the heat sink 104 may be used to conduct heat for an attachment process, such as wire bonding, the electrical interconnects 110 to the integrated circuit die 102.

Figure 6:
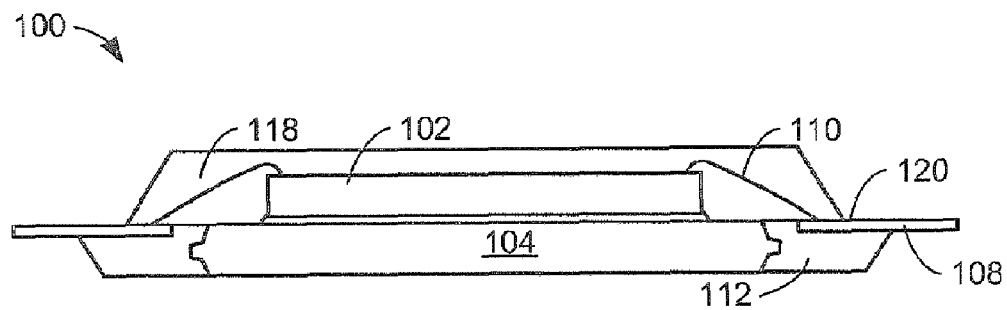
FIG. 6 is a cross-sectional view of the first integrated circuit package system in a second encapsulation phase with the second molding compound.

Referring now to FIG. 6, therein is shown a cross-sectional view of the first integrated circuit package system 100 in a second encapsulation phase with the second molding compound 118. The second molding compound 118 encapsulates the integrated circuit die 102, the electrical interconnects 110, and the inner portion of the external interconnects 108 from the top 120. The first molding compound 112 and the second molding compound 118 attach forming a hermetic seal protecting the integrated circuit die 102 and the electrical interconnects 110 as well as the heat sink 104 without requiring additional structure or space for the heat sink 104.

Figure 7:
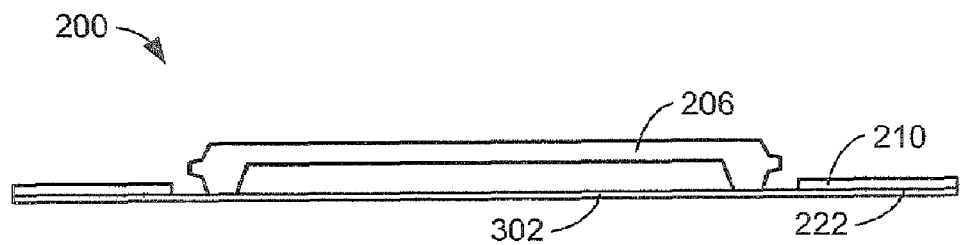
FIG. 7 is a cross-sectional view of the second integrated circuit package system in a mounting phase of the heat sink.

Referring now to FIG. 7, therein is shown a cross-sectional view of the second integrated circuit package system 200 in a mounting phase of the heat sink 206. The coverlay tape 302 attaches to the top 222 of the external interconnects 210. The heat sink 206 attaches to the coverlay tape 302. The heat sink 206 may be picked and placed on the coverlay tape 302 for an adhesiveless attachment or may be provided pre-attached by a lead frame supplier. The heat sink 206 does not contact the external interconnects 210 avoiding inadvertent connections.

Figure 8:
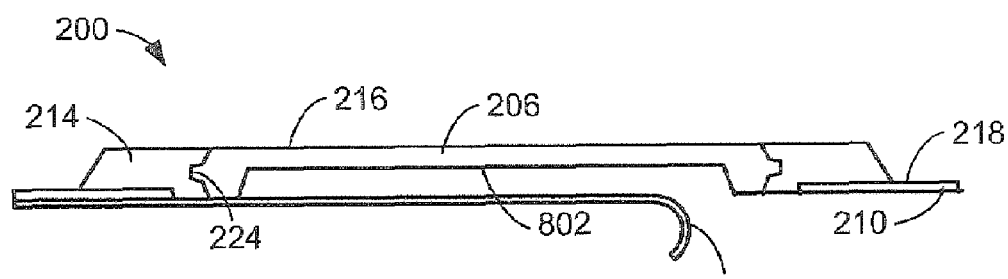
FIG. 8 is a cross-sectional view of the second integrated circuit package system in a first encapsulation phase with the first molding compound.

Referring now to FIG. 8, therein is shown cross-sectional view of the second integrated circuit package system in 200 a first encapsulation phase with the first molding compound 214. The first molding compound 214 encapsulates the heat sink 206 with the registration 224 acting as the anchor with the coverlay tape 302 preventing the first molding compound 214 from filling the recess 204. The first molding compound 214 encapsulates the inner portion of the external interconnects 210 from the bottom 218. The bottom surface 216 of the heat sink 206 may be exposed with a number of processes, such as chemical and mechanical planarization (CMP). An optional post-mold deflash process, such as a mechanical or chemical deflash, may be performed to eliminate resin bleeds and mold flash on the heat sink 206 and wire bonding surfaces on the external interconnects 210. The heat sink 206 within the first molding compound 214 eliminates the need for epoxy paste dispensing and curing for the attachment of the heat sink 206. The coverlay tape 302 is removed from the structure for further processing. For illustrative purpose, the coverlay tape 302 is shown as curled from the removing action, such as peeling, although it is understood that the coverlay tape 302 is typically planar next to the heat sink 206, the external interconnects 210, and the first molding compound 214.

Figure 9:
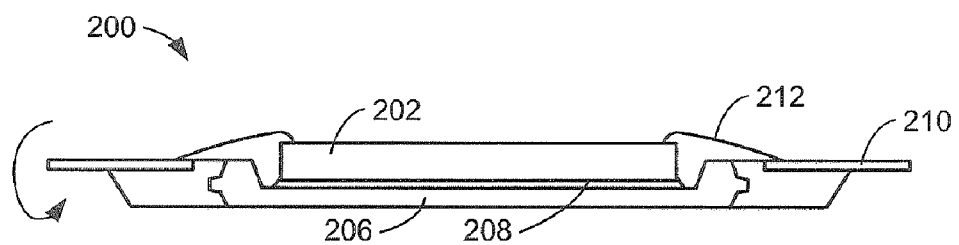
FIG. 9 is a cross-sectional view of the second integrated circuit package system in an attachment phase of the integrated circuit die.

Referring now to FIG. 9, therein is shown a cross-sectional view of the second integrated circuit package system 200 in an attachment phase of the integrated circuit die 202. The integrated circuit die 202 attaches to the heat sink 206 with the adhesive 208. The electrical interconnects 212 connect the integrated circuit die 202 and the inner portion of the external interconnects 210. The heat sink 206 is exposed such that the heat sink 206 may be used to conduct heat for an attachment process, such as wire bonding, the electrical interconnects 212 to the integrated circuit die 202.

Figure 10:
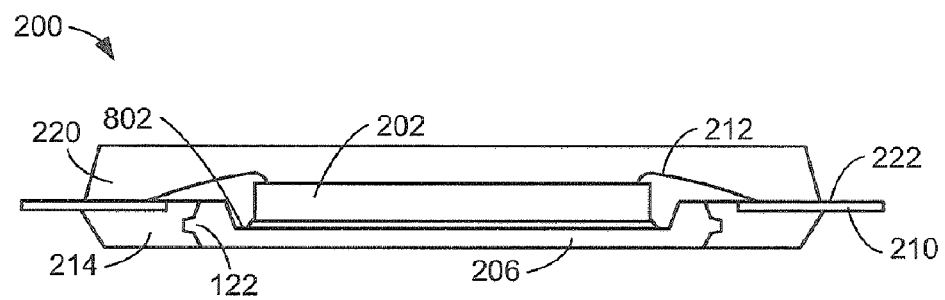
FIG. 10 is a cross-sectional view of the second integrated circuit package system in a second encapsulation phase with the second molding compound.

Referring now to FIG. 10, therein is shown a cross-sectional view of the second integrated circuit package system 200 in a second encapsulation phase with the second molding compound 220. The second molding compound 220 encapsulates the integrated circuit die 202, the electrical interconnects 212, and the inner portion of the external interconnects 210 from the top 222. The second molding compound 220 also fills the recess 802 around the integrated circuit die 202. The first molding compound 214 and the second molding compound 220 attach forming a hermetic seal protecting the integrated circuit die 202 and the electrical interconnects 212 as well as the heat sink 206 without requiring additional structure or space for the heat sink 206.

Figure 11:
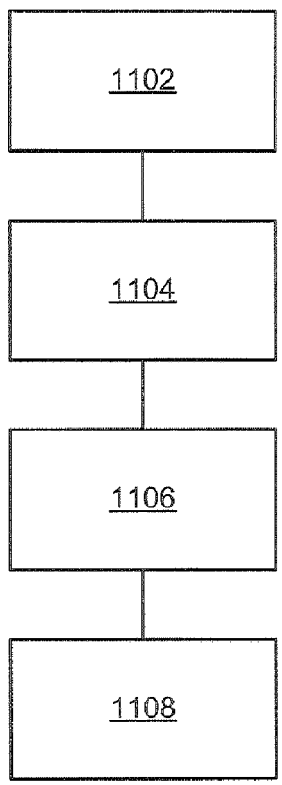
FIG. 11 is a flow chart of an integrated circuit package system for manufacture of the integrated circuit package system in an embodiment of the present invention.

Referring now to FIG. 11, therein is shown a flow chart of an integrated circuit package system 1100 for manufacture of the first integrated circuit package system 100 in an embodiment of the present invention. The system 1100 includes forming an external interconnect from a padless lead frame in a block 1102; encapsulating a heat sink and the external interconnect in a block 1104; mounting an integrated circuit die on the heat sink in a block 1106; and encapsulating the integrated circuit die, the heat sink, and the external interconnect in a block 1108.

It has been discovered that the present invention thus has numerous aspects.

It has been discovered that the integrated circuit package system provides a low cost manufacturing solution by simplifying handling methods, simplifying some manufacturing equipment design, alleviates and eliminates other causes that may result in potential yield issues. The two-step molding process encapsulates the heat sink providing improved thermal performance while providing low package height and maintaining package dimensions similar to high volume standard dimensions to keep the cost down.

An aspect is that the present invention provides two-step molding of the integrated circuit package, such as leaded QFP or QLP packages, encasing the integrated circuit die, wire interconnects connecting the integrated circuit die to the integrated circuit package leads or pins, and the heat sink without additional structures or space required for the heat sink. The packaging manufacturing process allows the heat sink to be attached and held in place with the molding compound without an adhesive to hold the heat sink. Epoxy paste dispensing and curing to attach the heat sink have been eliminated to simplify the manufacturing process. The heat sink may be pre-attached to the lead frame by the lead frame supplier to simplify the manufacturing process.

Another aspect of the present invention is that the integrated circuit package resulting from the two-step molding process provides the heat sink as the die paddle for the integrated circuit die. The heat sink attachment with the integrated circuit provides an improved thermal dissipation characteristic from the integrated circuit die for an improved thermal performance of the integrated circuit package. The heat sink may also be used to conduct heat for attaching the bond wires to the integrated circuit die.

Yet another aspect of the present invention is that the recess of the heat sink offers a low profile packaging solution with the improved thermal performance. The recess also improves the electrical performance and wire bonding yield from the shortened bond wires with the integrated circuit die closer to the bonding sites of the leads.

Yet another important aspect of the present invention is that it valuably supports and services the historical trend of reducing costs and increasing performance. These and other valuable aspects of the present invention consequently further the state of the technology to at least the next level.

Thus, it has been discovered that the integrated circuit package system method of the present invention furnishes important and heretofore unknown and unavailable solutions, capabilities, and functional aspects for increasing chip density in systems. The resulting processes and configurations are straightforward, cost-effective, uncomplicated, highly versatile and effective, can be implemented by adapting known technologies, and are thus readily suited for efficiently and economically manufacturing stacked integrated circuit packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
   forming an external interconnect from a padless lead frame;
   encapsulating a heat sink and an inner portion of the external interconnect including forming a first molding compound to a thickness equal to a sink thickness of the heat sink and forming the first molding compound having the thickness less than an interconnect height of the external interconnect;
   mounting an integrated circuit die on the heat sink with an adhesive;
   attaching an electrical interconnect between the integrated circuit die and the inner portion of the external interconnect; and
   encapsulating the integrated circuit die, the heat sink, and the external interconnect.

2. The system as claimed in claim 1 wherein encapsulating the heat sink and the inner portion of the external interconnect from the bottom of the external interconnect comprises placing the heat sink within a center of the padless lead frame.

3. The system as claimed in claim 1 wherein attaching the electrical interconnect between the integrated circuit die and the inner portion of the external interconnect comprises attaching a bond wire between the integrated circuit die and the external interconnect.

4. The system as claimed in claim 1 wherein mounting the integrated circuit die on the heat sink with the adhesive comprises attaching the integrated circuit on the heat sink with a thermally conductive adhesive.

5. An integrated circuit package system comprising:
   an external interconnect from a padless lead frame;
   a first molding compound around a heat sink and the external interconnect, the first molding compound and the heat sink of equal thickness, and the first molding compound has less thickness than an interconnect height of the external interconnect;
   an integrated circuit die in a recess of the heat sink; and
   a second molding compound to cover the integrated circuit die in the recess, the heat sink, and the external interconnect.

6. The system as claimed in claim 5 further comprising a bottom surface of the heat sink exposed.

7. The system as claimed in claim 5 wherein the second molding compound to cover the integrated circuit die and the lead comprises:
   the second molding compound attached to the first molding compound; and
   a hermetic seal formed with the first molding compound and second molding compound.

8. The system as claimed in claim 5 wherein the first molding compound around the heat sink and the external interconnect comprises a registration of the heat sink in the first molding compound.

9. The system as claimed in claim 5 wherein:
   the external interconnect forming the padless lead frame is a lead;
   the first molding compound covers the heat sink and the external interconnect;
   the integrated circuit die on the heat sink is a wire bond integrated circuit;
   the second molding compound covers the integrated circuit die and the heat sink; and
further comprising:
   the first molding compound from a bottom of the external interconnect;
   an adhesive between the integrated circuit die and the heat sink; and
   an electrical interconnect between the integrated circuit die and the external interconnect.

10. The system as claimed in claim 9 wherein the first molding compound to cover the heat sink and the external interconnect has the heat sink within a center of the padless lead frame.

11. The system as claimed in claim 9 wherein the electrical interconnect between the integrated circuit die and the external interconnect is a bond wire between the integrated circuit die and the external interconnect.

12. The system as claimed in claim 9 wherein the adhesive between the integrated circuit die and the heat sink is a thermally conductive adhesive for transferring heat from the integrated circuit die to the heat sink.

* * * * *